United States Patent
Takiar et al.

(10) Patent No.: US 10,485,125 B2
(45) Date of Patent: Nov. 19, 2019

(54) INTEGRATED USB CONNECTOR AND MEMORY DEVICE

(71) Applicant: Western Digital Technologies, Inc., San Jose, CA (US)

(72) Inventors: Hem Takiar, Fremont, CA (US); Michael Patterson, Portland, OR (US); Nandha Kumar Mohanraj, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/852,525

(22) Filed: Dec. 22, 2017

(65) Prior Publication Data

US 2019/0200471 A1    Jun. 27, 2019

(51) Int. Cl.
| | | |
|---|---|---|
| *H05K 5/00* | (2006.01) | |
| *H05K 5/02* | (2006.01) | |
| *H01R 13/66* | (2006.01) | |
| *H01R 13/50* | (2006.01) | |

(52) U.S. Cl.
CPC .......... *H05K 5/0278* (2013.01); *H01R 13/50* (2013.01); *H01R 13/6658* (2013.01); *H05K 5/0247* (2013.01)

(58) Field of Classification Search
CPC .... H05K 5/0278; H05K 5/0247; H01R 13/05; H01R 13/6658
USPC .......................................... 361/728–730, 752
See application file for complete search history.

(56) References Cited

U.S. PATENT DOCUMENTS

| | | | | |
|---|---|---|---|---|
| 4,361,955 A | * | 12/1982 | Lancaster | H01R 13/582 29/874 |
| 7,165,998 B2 | * | 1/2007 | Lee | H01R 13/6658 439/660 |
| 7,440,286 B2 | * | 10/2008 | Hiew | G06K 19/077 361/715 |
| 9,640,885 B2 | * | 5/2017 | Amini | H01R 12/73 |
| 9,979,102 B2 | * | 5/2018 | Zhao | H01R 9/032 |
| 2007/0295982 A1 | * | 12/2007 | Ryu | G06K 19/07732 257/99 |
| 2013/0109235 A1 | | 5/2013 | Chou et al. | |

FOREIGN PATENT DOCUMENTS

CN    106252344 A    12/2016

OTHER PUBLICATIONS

English language Abstract for CN106252344 published Dec. 21, 2016.

* cited by examiner

*Primary Examiner* — Hung S. Bui
(74) *Attorney, Agent, or Firm* — Vierra Magen Marcus LLP (57) ABSTRACT

A USB device is disclosed including an integrated memory module and USB connector. Integration of the memory module with the USB connector according to the present technology provides a USB device with a compact footprint and efficient heat transfer to a host device in which the USB device is used.

29 Claims, 11 Drawing Sheets

INTEGRATED USB CONNECTOR AND MEMORY DEVICE

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large storage capacity, have made such memory devices ideal for use in a wide variety of electronic devices, including for example computers, digital cameras, digital music players, video game consoles, PDAs and cellular telephones.

Equally ubiquitous is the universal serial bus (USB) interface for transferring data and information between devices such as those named above. A typical USB storage device includes a memory portion coupled to a USB connector capable of mating within a USB slot of a host device. The memory portion typically includes a printed circuit board on which are mounted one or more flash memory chips, a controller, passive components and possibly an LED for indicating when the memory is being accessed. While there are several types of USB connectors, there is a recent trend toward the type-C USB device, including power and data lines with a reversible connector.

During a conventional fabrication process, the memory portion and the USB connector are formed separately, and then affixed to each other, as by welding and/or soldering. Thereafter, the memory portion may be covered by the shield. This type of device has a relatively large footprint, which can be problematic for example when protruding from the USB slot of a host device such as a computer. The protruding USB device can catch, and come out or otherwise break, when the host device is stored or transported. Additionally, the separate memory portion and large footprint make it difficult to conduct heat away from heat-producing elements of the memory portion, thereby adversely affecting the speed and operation of the memory portion.

DETAILED DESCRIPTION

The present technology will now be described with reference to the figures, which in embodiments, relate to a universal serial bus (USB) device including an integrated memory module and USB connector. Integration of the memory module with the USB connector according to the present technology provides a USB device with a compact footprint and efficient heat transfer to a host device in which the USB device is used.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±0.25%.

An embodiment of the present technology will now be explained with reference to the flowchart of FIG. 1 and the top, side, bottom and perspective views of FIGS. 2 through 34. In step 200, a system in a package (SIP) module 100 is formed. Although several of the figures show an individual SIP module 100, it is understood that the SIP module 100 may be batch processed along with a plurality of other SIP modules on substrate panels to achieve economies of scale. The number of rows and columns of SIP modules 100 on the substrate panels may vary. SIP module 100 may alternatively be referred to herein as a semiconductor device 100.

Figure 2:
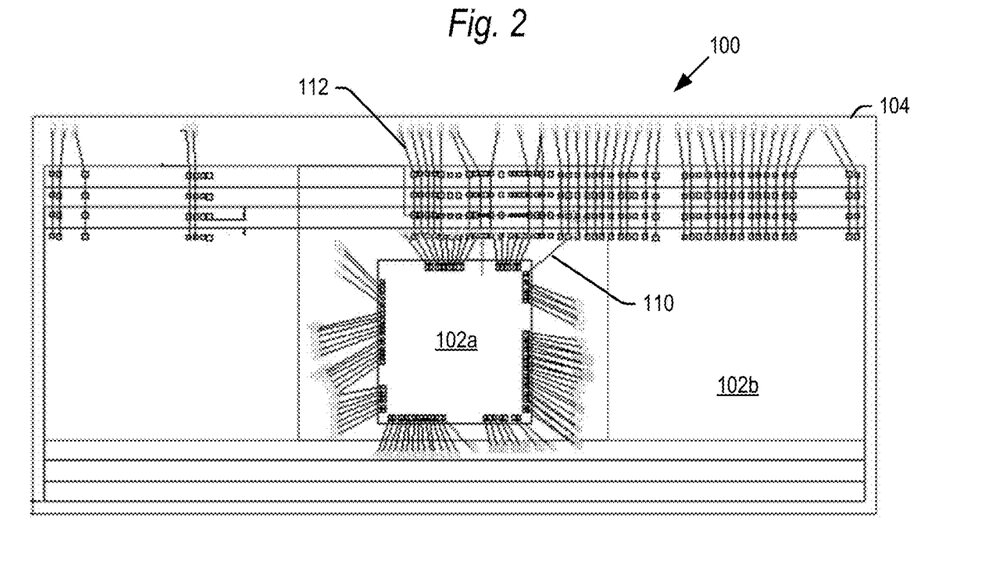
FIG. 2 is a top view of a system in a package module according to an embodiment of the present technology.
Figure 3:
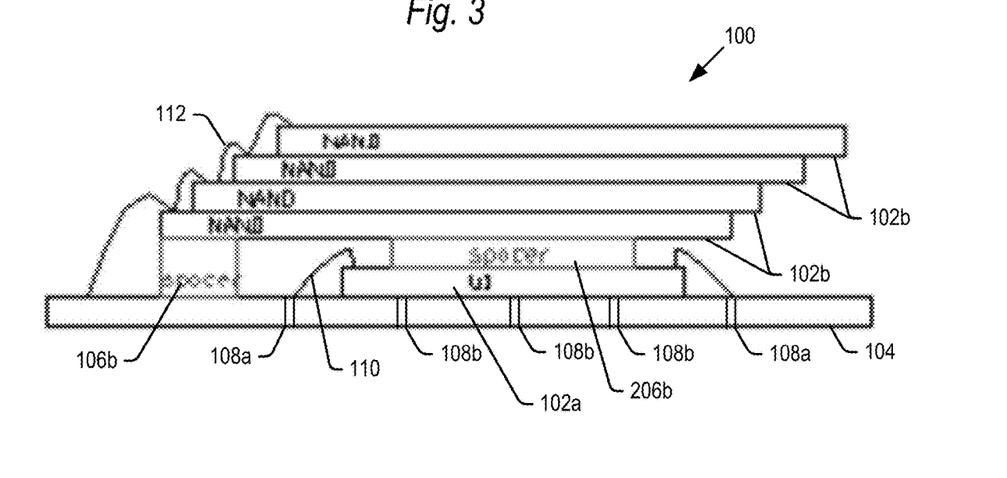
FIG. 3 is an edge view of a system in a package module according to an embodiment of the present technology.

In embodiments, the SIP module 100 may comprise one or more semiconductor die 102 mounted on a substrate 104. In embodiments, the semiconductor die may comprise a controller die 102a mounted directly on the substrate 104, and one or more flash memory die 102b supported on the substrate, over the controller die, by one or more spacers 106. The controller die 102a would not be visible from the top view of FIG. 2, as it would be covered by the flash memory die 102b, but the controller die 102a is shown in FIG. 2 for ease of understanding.

The substrate 104 may be a variety of different chip carrier mediums, including a printed circuit board (PCB), a leadframe or a tape automated bonded (TAB) tape. Where substrate 104 is a PCB, the substrate may be formed of a core having a top and bottom conductive layer each of which may be etched into a conductance pattern including electrical traces, contact pads and contact fingers as explained below. The core may be formed of various dielectric materials such as for example, polyimide laminates, epoxy resins including FR4 and FR5, bismaleimide triazine (BT), and the like. Vias 108 may be formed through the substrate 104. Vias 108a may be used to electrically connect traces on a first surface of the substrate with traces on a second surface of the substrate. Vias 108b may act as thermal vents, venting heat away from the controller die 102a as explained below.

The controller die 102a may for example be an ASIC that is electrically connected to the substrate 104 by wire bonds 110. In further embodiments, the controller die may include solder or other metal on die bond pads to mount to the substrate 104 in a flip-chip arrangement. In embodiments where the controller die 102a is wire bonded to the substrate, there may be a pair of spacers 106. A first spacer 106a may support the memory die 102b above the controller die 102a while providing space under the memory die 102b for the wire bonds 110. A second spacer 106b may support the memory die 102b over the substrate 104 while providing space under the memory die 102b for both the controller 102a and wire bonds 110. It is conceivable that the semiconductor device 100 include memory die 102b but not the controller die 102a. In such an embodiment, the memory die may be mounted directly on the substrate 104 an the spacers 106 may also be omitted.

The flash memory die 102b may for example be NAND flash memory, but could be other types of memory die, such as SDRAM, in further embodiments. In the embodiment shown, there are four memory die 102b, stacked in an offset stepped configuration enabling stepped wire bonding of each memory die 102b to the substrate 104 via wire bonds 112. It is understood that there may be fewer or greater than four memory die in further embodiments, including for example two, eight or sixteen memory die. Other numbers of memory die are contemplated. The semiconductor memory die 102b may be stacked directly on top of each other in further embodiments, and for example electrically connected to the substrate 104 using through silicon vias (TSV). The semiconductor die 102a, 102b and wire bonds 110, 112 may be encased in molding compound (not shown), though the molding compound may be omitted in further embodiments.

Figure 1:
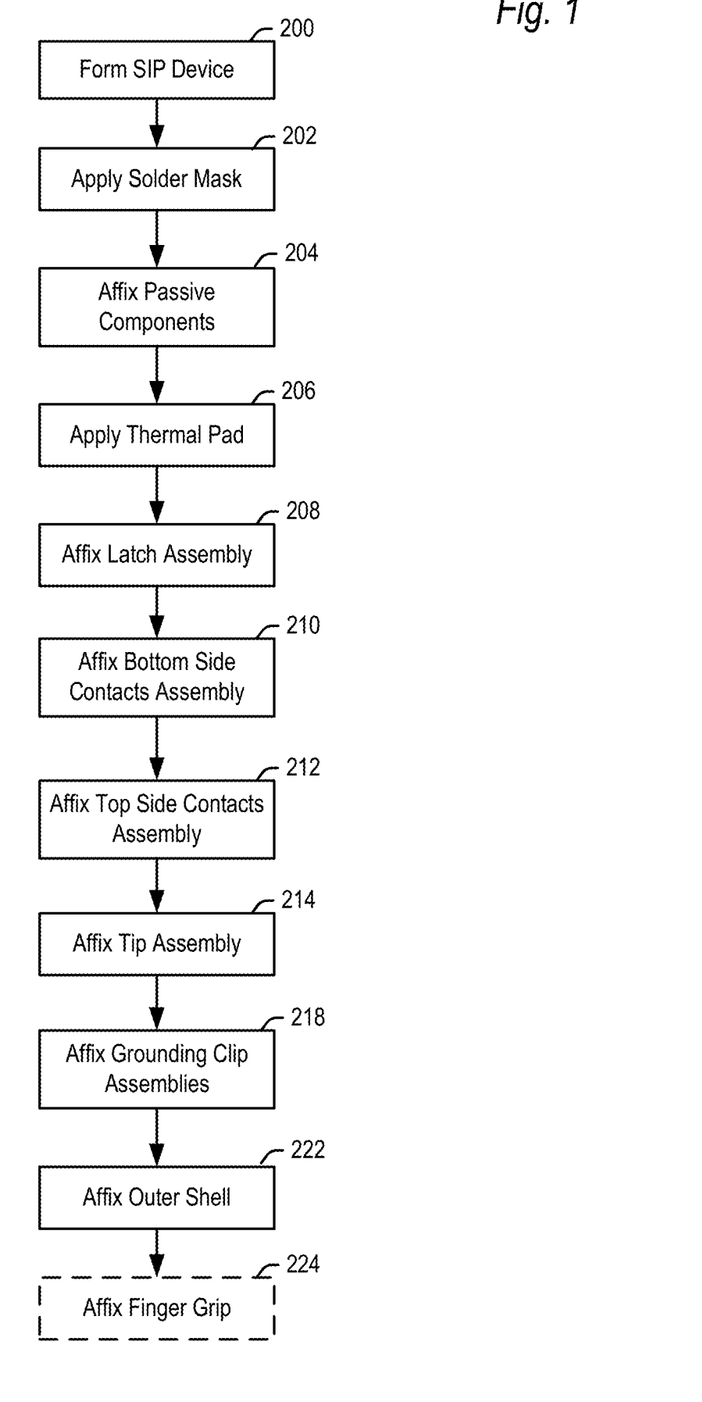
FIG. 1 is a flowchart of the overall fabrication process of a USB semiconductor device according to embodiments of the present technology.
Figure 4:
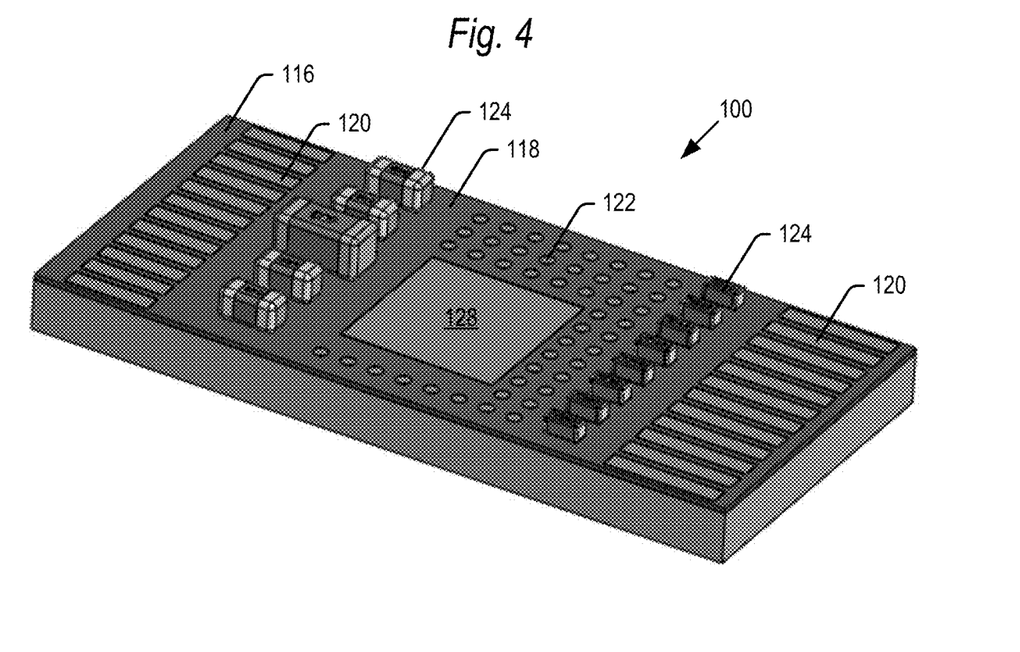
FIG. 4 is a perspective view of a system in a package module including passive components according to an embodiment of the present technology.
Figure 5:
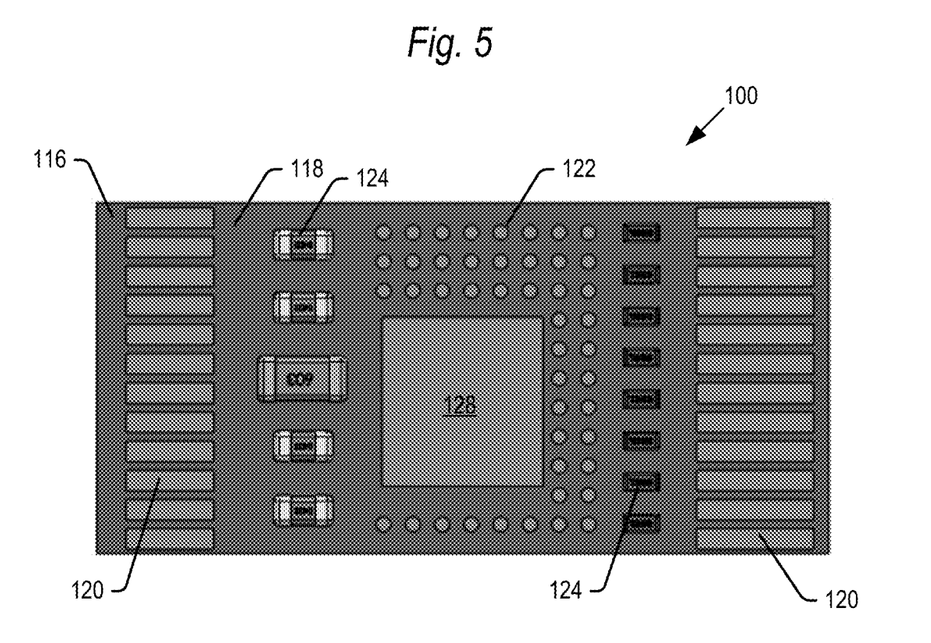
FIG. 5 is a top view of a system in a package module including passive components according to an embodiment of the present technology.

FIGS. 4 and 5 show perspective and top views, respectively, of a surface 116 of the SIP module 100 including a layer 118 of solder mask applied in a step 202 (FIG. 1). Surface 116 also includes a conductance pattern having contact fingers 120 and test pads 122. Contact fingers 120 are used for all input/output (I/O) of data and signals to and from the controller die 102a, as well as power and ground. As explained below, the contact fingers 120 at opposed sides of the SIP module 100 receive electrical contacts from top side and bottom side contacts assemblies to electrically couple the contact fingers 120 with an end of the USB device received within a host USB slot. Test pads 122 are used to test the SIP module 100 prior to inclusion within the USB semiconductor device.

Passive components 124 may also be affixed to surface 116 in a step 204. The passive components may include for example one or more capacitors, resistors and/or inductors, though other components are contemplated. The passive components 124 shown are by way of example only, and the number, type and position may vary in further embodiments. Passive components 124 may be affixed to contact pads on the surface 116 using solder in a reflow step.

A thermal pad 128 may also be affixed to surface 116 in a step 206. The thermal pad is used to draw heat away from the controller die 102a, through thermal vent vias 108b. The thermal pad may be formed of metal such as copper, though it could be formed of a heat-conducting dielectric material such as graphene in further embodiments.

In step 208, a latch assembly 130 may be affixed to the SIP module 100 as will now be explained with reference to FIGS. 6-9. The latch assembly 130 may include a base 132 and a pair of longitudinally extending arms 134 terminating in a pair of tabs 136. As shown in the perspective, top and edge views of FIGS. 7-9, respectively, the base 132 may be received over the thermal pad 128 so as to carry heat from the SIP module 100 away from the thermal pad 128 and into the pair of arms 134. The latch assembly 130 may for example be affixed to the SIP module 100 by soldering the base 132 to the thermal pad 128. The latch assembly 130 may be formed of various metals including copper and stainless steel but may be formed of other, preferably heat conducting, materials in further embodiments.

The arms 134 may be affixed to opposed ends of the base 132 and may be mirror images of each other. First ends of the arms 134 (nearest the base 132) may be spaced apart from each other by distance equal to a width of the SIP module 100. The first ends of the arms 134 may also be used carry heat away from the SIP module 100. A pair of channels 136 may be provided in the arms 134 for spacing distal ends of the arms 134 away from the SIP module 100. As explained below, the channels 136 may receive alignment features of the top side contacts assembly to aid in positioning the top side contacts assembly on the SIP module 100. Second ends of the arms 134, opposite the first ends, may include tabs 136. The tabs 136 may be used to provide a snap fit and tactile feel of the USB device as it attaches and detaches from a USB port of a host device as in conventional type-C USB devices.

Figure 10:
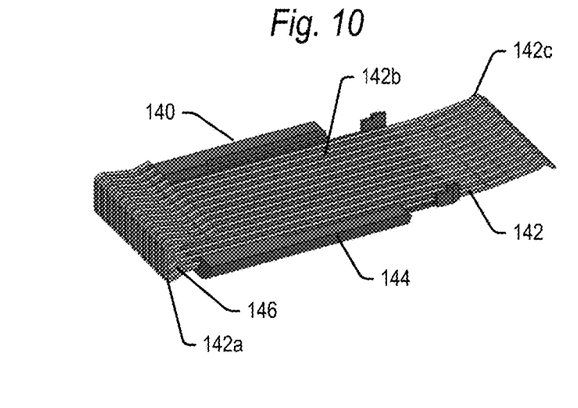
FIG. 10 is a perspective view of a bottom side contacts assembly according to an embodiment of the present technology.

In step 210, a bottom side contacts assembly 140 may be affixed to a bottom surface of SIP module 100 (i.e., a surface of SIP module 100 opposite surface 116) as shown in FIGS. 10-13. Referring initially to FIG. 10, the bottom side contacts assembly 140 includes a number of metal electrical contacts 142 mounted within a plastic base 144. The electrical contacts 142 have a first end 142a where the electrical contacts 142 bend upward and over themselves to define a space 146.

Figure 11:
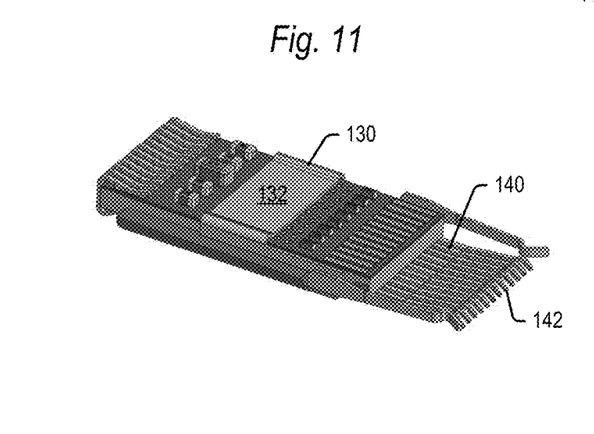
FIGS. 11-13 are perspective, edge and bottom views, respectively, of a bottom side contacts assembly mounted to the USB semiconductor device according to an embodiment of the present technology.
Figure 12:
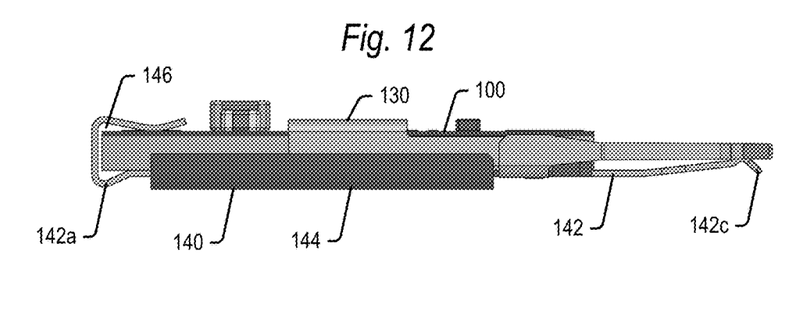
Figure 13:
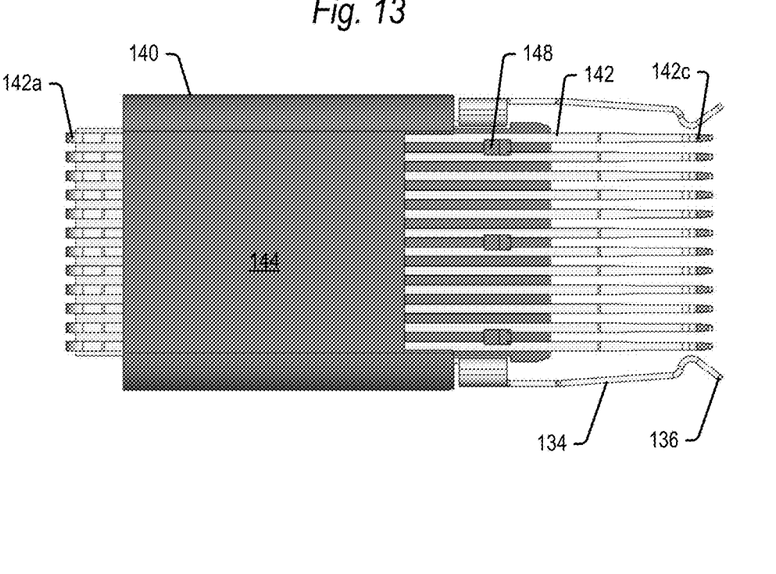

As seen for example in FIGS. 11 and 12, the bottom side contacts assembly 140 may be slid onto the SIP module 100 so that a rear (or distal) edge of the SIP module 100 is received within the space 146, and the electrical contacts 142 at end 142a lie against the contact fingers 120 at the rear edge of the SIP module 100. The electrical contacts 142 may be soldered to the contact fingers 120 in a reflow process to ensure good contact therebetween. In embodiments, the number of contact fingers 120 at the rear edge of SIP module 100 may match the number of electrical contacts 142 in the bottom side contacts assembly 140. However, there may be more or less contact fingers 120 than there are electrical contacts 142 in further embodiments.

A middle portion 142b of the electrical contacts 142 extend beneath the SIP module 100 and a front (or proximal) end 142c of the electrical contacts extend out in front of the SIP module 100. In embodiments, the number of electrical contacts 142 may be the number of electrical contacts on one half of a conventional type-C USB device, and the physical configuration of the electrical contacts 142 at the second end 142c match the configuration of the electrical contacts of a conventional type-C USB device.

In embodiments, the electrical contacts 142 may be affixed to each other with tie bars (not shown) when the electrical contacts are initially assembled into the plastic base 144. The plastic base 144 may include bosses 148 or other protrusions which mate with openings between the electrical contacts 142 to allow the electrical contacts 142 to snap fit into the base 144. Once assembled within the base 144, the tie bars may be removed to electrically and physically isolate each of the electrical contacts 142 in the bottom side contacts assembly 140.

Figure 14:
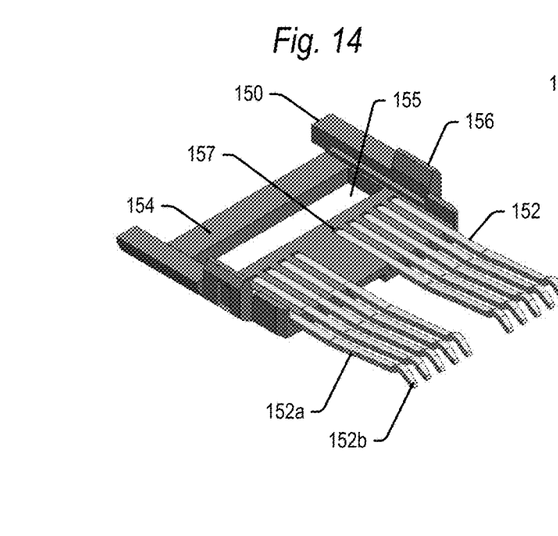
FIG. 14 is a perspective view of a top side contacts assembly according to an embodiment of the present technology.

In step 212, a top side contacts assembly 150 may be affixed to the top surface 116 of SIP module 100 as shown in FIGS. 14-17. Referring initially to FIG. 14, the top side contacts assembly 150 includes a number of metal electrical contacts 152 mounted within a plastic base 154. The electrical contacts include a middle portion 152a and a front end portion 152b. The base 154 also includes a window 155. As seen for example in FIGS. 15 and 16, the top side contacts assembly 150 may be placed down on top of the SIP module 100 so that one or more rows of the passive components 124 seat within the window 155.

Figure 15:
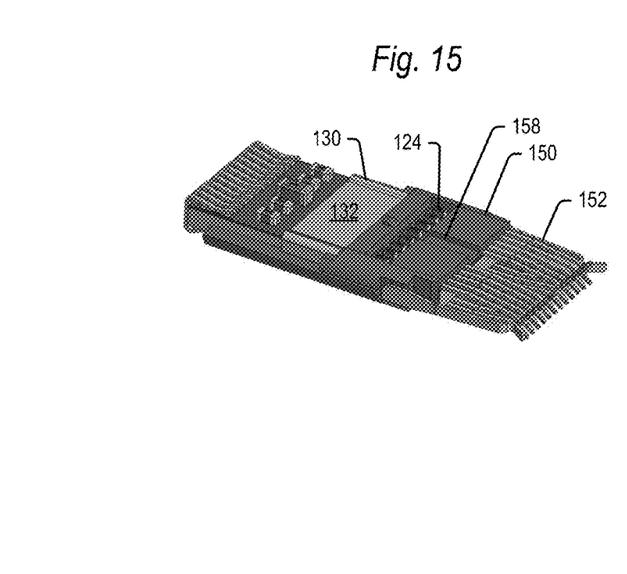
FIGS. 15-17 are perspective, edge and top views, respectively, of a top side contacts assembly mounted to the USB semiconductor device according to an embodiment of the present technology.
Figure 16:
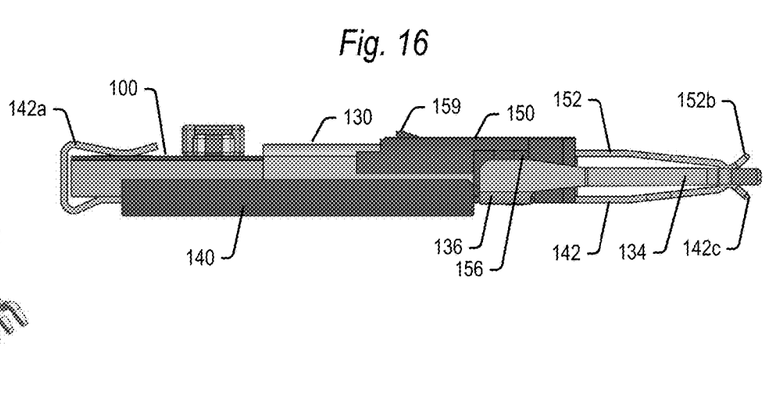
Figure 17:
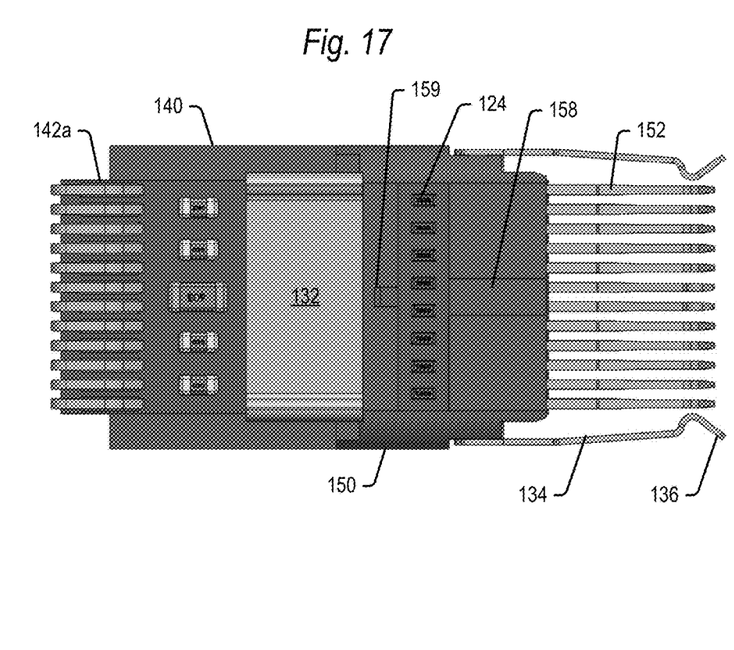

The plastic base 154 may include alignment features 156 which mate within the channels 136 of the latch assembly 130 as shown in FIGS. 15 and 16 to hold the top side contacts assembly 150 in place on top of the SIP module 100. The top side contacts assembly 150 need not be held firmly by the alignment features 156, as the top side contacts assembly and other assemblies are sealed within an outer shell as explained below.

When mounted on the SIP module 100, the electrical contacts 152 at the middle portion 152a lie against the contact fingers 120 at the front edge of the SIP module 100. The electrical contacts 152 may be soldered to the contact fingers 120 in a reflow process to ensure good contact therebetween. In embodiments, the number of contact fingers 120 at the front edge of SIP module 100 may match the number of electrical contacts 152 in the top side contacts assembly 150. However, there may be more or less contact fingers 120 than there are electrical contacts 152 in further embodiments.

In embodiments, the number of electrical contacts 152 may be the number of electrical contacts on one half of a conventional type-C USB device. As seen for example in FIG. 16, the configuration of the electrical contacts 152 at the end portion 152b are the mirror image of the contacts 142 at front end portion 142c of the bottom side contacts assembly 140. Thus, the contacts 142 and 152 at the front of the bottom and top assemblies match the configuration of the electrical contacts of a conventional type-C USB device. The bottom and top contacts 142, 152 may provide a reversible, redundant connection in accordance with the type-C USB standard.

In embodiments, the electrical contacts 152 may be affixed to each other with tie bars (not shown) when the electrical contacts are initially assembled into the plastic base 154. The plastic base 154 may include slots 157 which receive the electrical contacts 152 to allow the electrical contacts 152 to snap fit into the base 154. Once assembled within the base 154, the tie bars may be removed to electrically and physically isolate each of the electrical contacts 152 in the top side contacts assembly 150.

The plastic base 154 further includes a slot 158 to align a tip assembly to the top side contacts assembly 150 and SIP module 100 as explained below. The plastic base 154 also includes a protruding catch 159 for locking an outer shell in position over the SIP module 100 as explained below.

Figure 18:
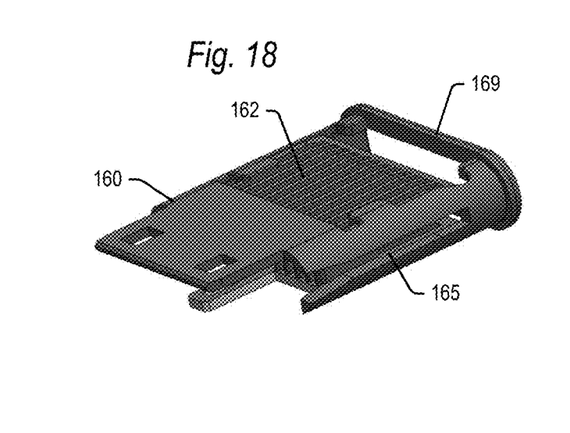
FIG. 18 is a perspective view of a tip assembly according to an embodiment of the present technology.

In step 214, a tip assembly 160 may be affixed to a front portion of the SIP module 100, over the front (proximal) ends 142c, 152b of contacts 142, 152 as shown in FIGS. 18-22. As seen in FIG. 18, the tip assembly 160 includes a first group of slots 162 on a bottom surface corresponding in number, shape and position to the electrical contacts 142 in the bottom side contacts assembly 140. When the tip assembly 160 is inserted over the end of the SIP module 100, the electrical contacts 142 position within the first group of slots 162 to provide support for, and maintain alignment of, the electrical contacts 142.

Figure 19:
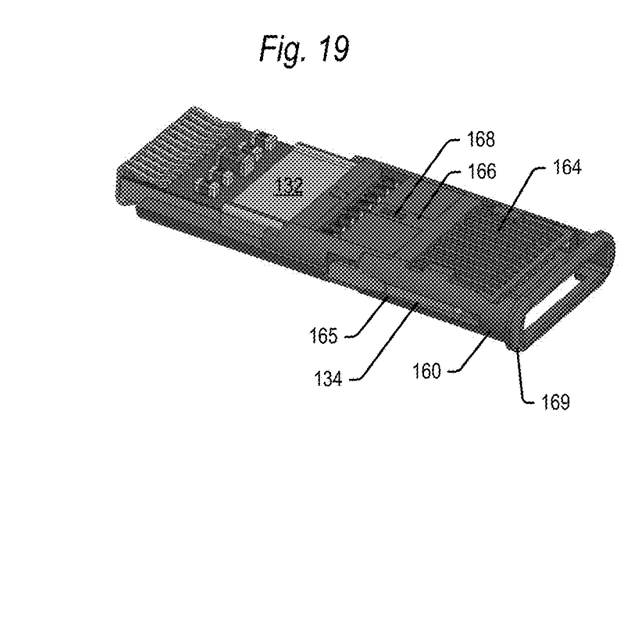
FIGS. 19-22 are perspective, top, edge and bottom views, respectively, of a tip assembly mounted to the USB semiconductor device according to an embodiment of the present technology.

As seen in FIG. 19, the tip assembly 160 includes a second group of slots 164 on a top surface corresponding in number, shape and position to the electrical contacts 152 in the top side contacts assembly 150. When the tip assembly 160 is inserted over the end of the SIP module 100, the electrical contacts 152 position within the second group of slots 164 to provide support for, and maintain alignment of, the electrical contacts 152.

Figure 20:
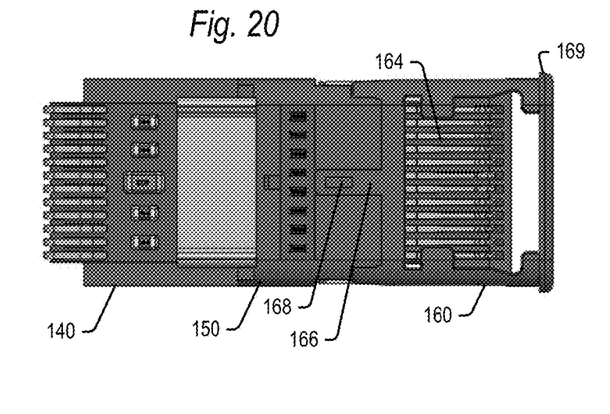
Figures 21, 22:
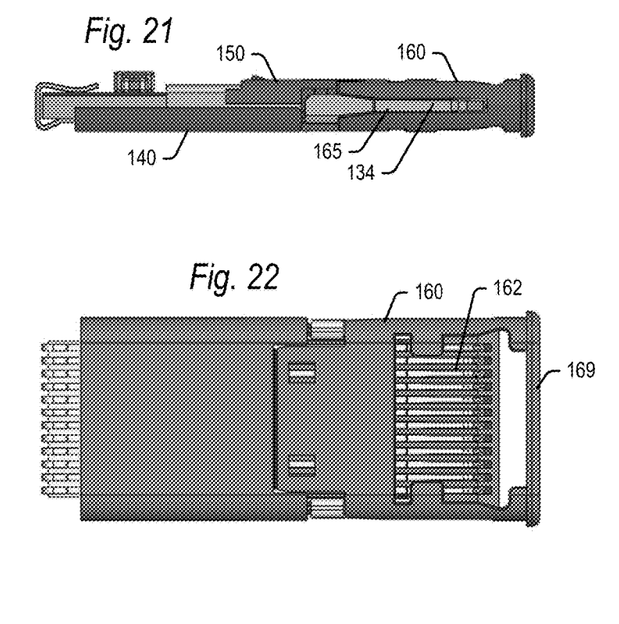

As seen in FIGS. 18, 19 and 21, the tip assembly 160 further includes elongate openings 165 on opposed edges of the tip assembly 160, within which seats the arms 134 of latch assembly 130. The top portion of the tip assembly 160 further includes tongue 166 which is received within a slot 158 of the top side contacts assembly 150 for guiding the tip assembly 160 into position. The tongue 166 includes a detent 168 to fasten the outer shell over the USB device as explained below. When fully inserted over the tip of the SIP module 100, the distal edges of the bottom and top surfaces lie adjacent the proximal edges of the bottom side contacts assembly 140 and the top side contacts assembly 150, respectively, as shown in FIGS. 19, 20 and 22.

The proximal-most portion of the tip assembly 160 includes an oblong shaped opening 169. The opening 169 may conform in size and shape to a front opening in a conventional type-C USB devices. The proximal ends 142*c* and 152*b* of electrical contacts 142, 152, and the tabs 136 of the latching assembly 130, may be located adjacent to but within the opening 169.

Figure 23:
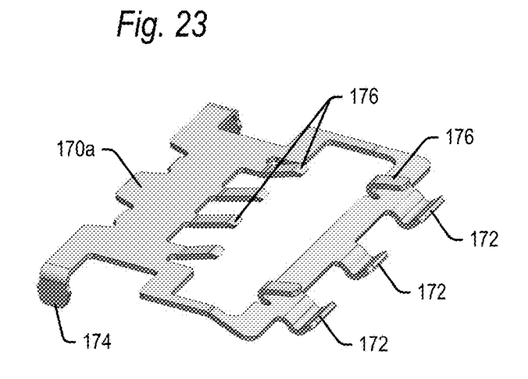
FIG. 23 is a perspective view of a grounding clip assembly according to an embodiment of the present technology.
Figure 24:
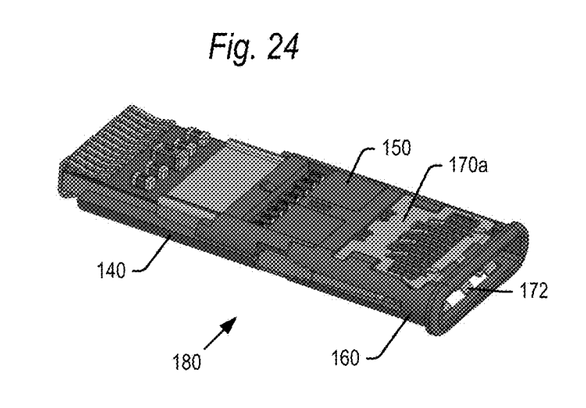
FIGS. 24-27 are perspective, top, edge and bottom views, respectively, of a grounding clip assembly mounted to the USB semiconductor device according to an embodiment of the present technology.
Figure 25:
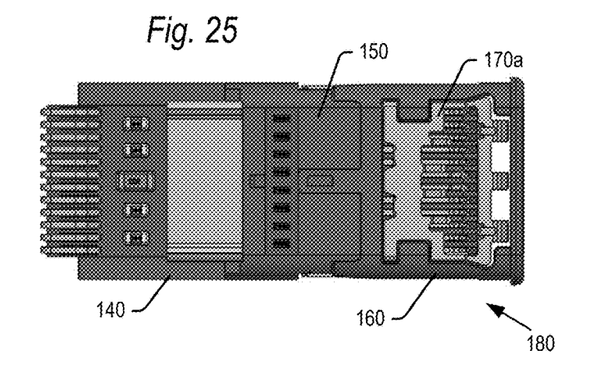
Figure 26:
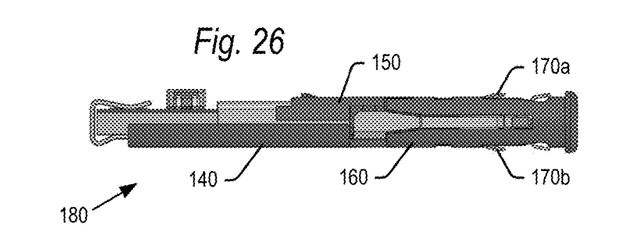
Figure 27:
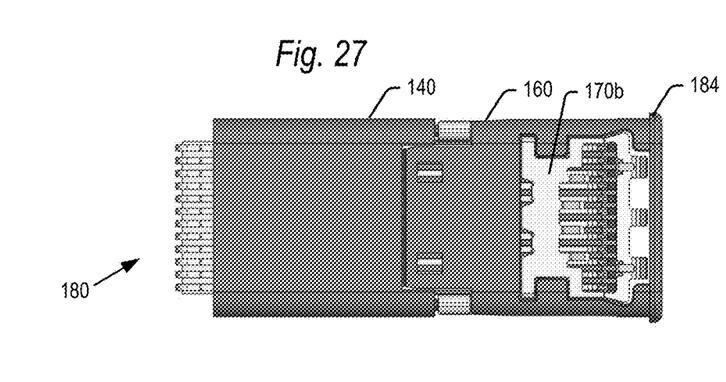

In step 218, a pair of grounding clip assemblies 170 may be affixed over the first and second groups of slots 162, 164 of the tip assembly 160 as shown in FIGS. 23-27. FIG. 23 shows a first (top) grounding clip assembly 170*a*, fitting for example over the top surface of the tip assembly 160 (electrically isolated from contacts 152) as shown in FIG. 24. The second (bottom) grounding clip assembly 170*b* may fit over the opposite (i.e., bottom) surface of the tip assembly 160 (collectively isolated from contacts 142) as shown in FIG. 27. The top and bottom grounding clip assemblies 170*a*, 170*b* may be identical to each other.

Each grounding clip assembly 170 includes one or more grounding clips 172 positioned adjacent the oblong opening 169 when the grounding clips 170 are mounted. The grounding clips 172 of 170 the top and bottom grounding clip assemblies are provided to engage components within a USB host slot, before those components engage electrical contacts 142, 152, to ground any electrostatic charge on those USB host slot components. A distal portion of each grounding clip 172 may include fingers 174 which lie in contact with arms 134 of latch assembly 130. The arms 134 are in turn grounded to the substrate 104 so as to ground the grounding clips 172 to the substrate 104. [Please confirm this is correct?].

The grounding clip assembly 170*a* and 170*b* on opposed sides of the SIP module 100 may be fixed in place by prongs 176 which engage portions of the outer shell once the outer shell is applied over the SIP module 100 and the above-described assemblies 140, 150 and 160. The prongs 176 also serve to ground the outer shell to the grounding clip assemblies 170.

Figure 28:
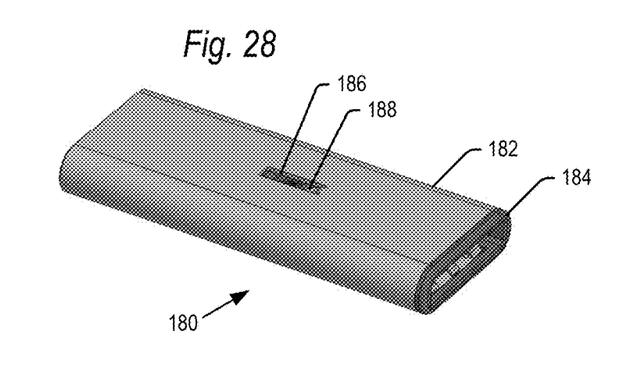
FIG. 28 is a perspective view of an outer shell according to an embodiment of the present technology.
Figure 29:
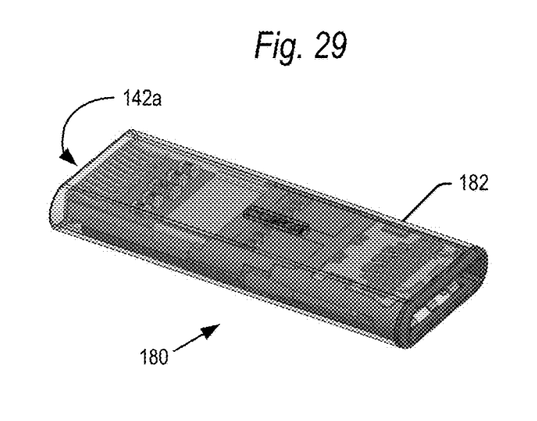
FIG. 29 is a perspective view of the USB semiconductor device positioned within an outer shell according to an embodiment of the present technology.
Figure 30:
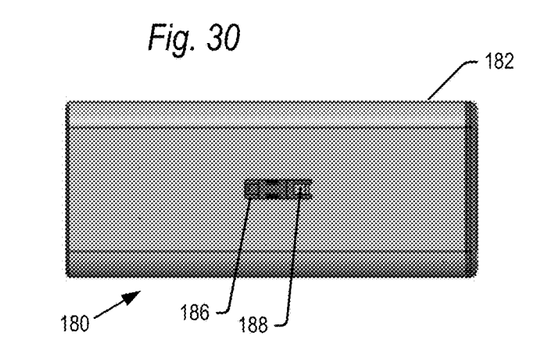
FIGS. 30-32 are top, edge and bottom views, respectively, of an outer shell around the USB semiconductor device according to an embodiment of the present technology.
Figure 31:
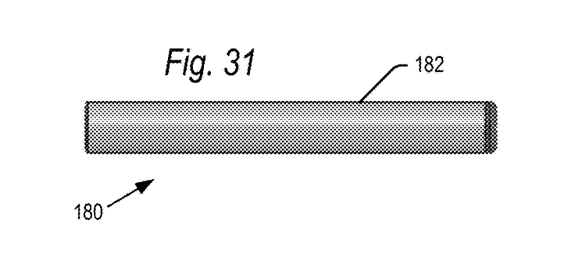
Figure 32:
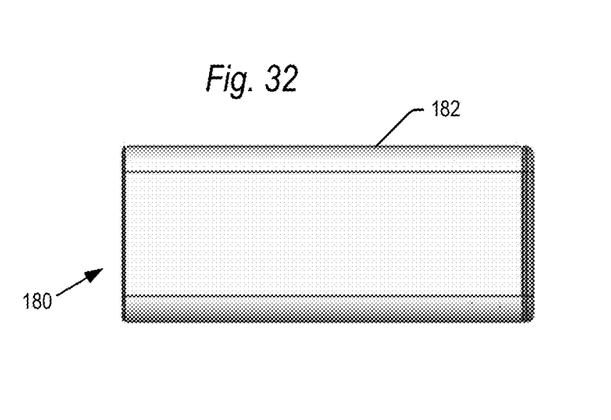

FIGS. 24-27 illustrate a functional USB device 180. In step 222, the USB device 180 may be encased in an outer shell 182 as shown in FIGS. 28-32. FIGS. 28, 30, 31 and 32 show perspective, top, edge and bottom views of the USB device 180 encased within the shell 182, respectively. FIG. 29 shows the components of the USB device 180 within the shell (shown as transparent in FIG. 29). The portions of the tip assembly 160 defining the oblong opening 169 may be formed with a protruding lip 184 (FIGS. 27 and 28). The shell 182 may be slid over the back end of the USB device 180 until a front end of the shell 182 abuts against and mates with the lip 184 to provide a smooth exterior to the USB device 180.

The shell 182 may include a slot 186 including a clip 188 at a proximal end. When the shell 182 is fully extended around the USB device 180, the slot 186 engages the catch 159 (FIG. 16) to prevent the shell from moving proximally relative to the SIP module 100. The clip 188 engages within detent 168 (FIGS. 19 and 20) to prevent the shell from moving distally relative to the SIP module. Thus, once fully positioned around the SIP module, SIP module 100 and assemblies 140, 150, 160 and 170 are fixed within the shell 182.

Figure 33:
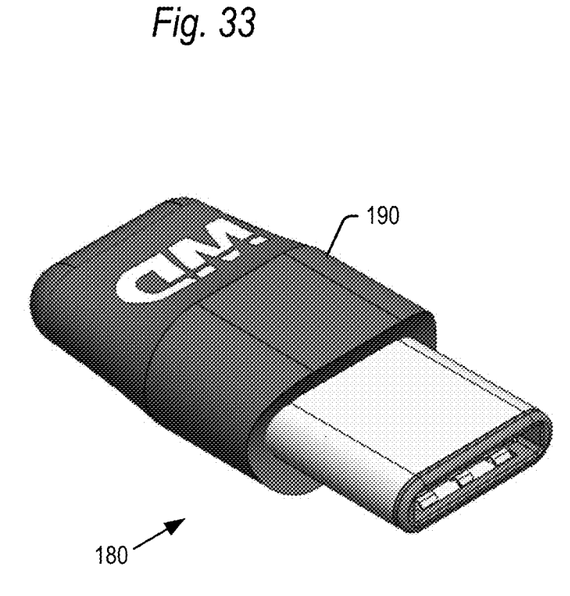
FIGS. 33-34 are different perspective views of a completed USB semiconductor device including a finger grip according to an embodiment of the present technology.
Figure 34:
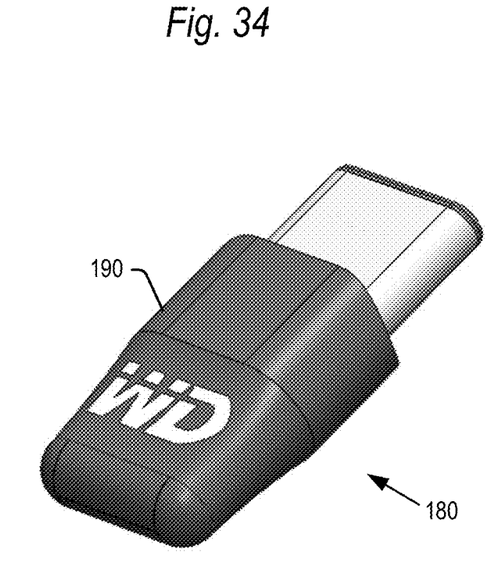

In step 224, a finger grip 190 may optionally be placed over the distal end of the USB device 180. The finger grip 190 may make it easier to insert and remove the USB device 180 from a host USB slot. The finger grip 190 may be omitted in further embodiments. Instead of a finger grip, a May be provided over the distal end of shell 182 which may be gripped to facilitate insertion and removal of the USB device 180 may host USB slot.

Figure 35:
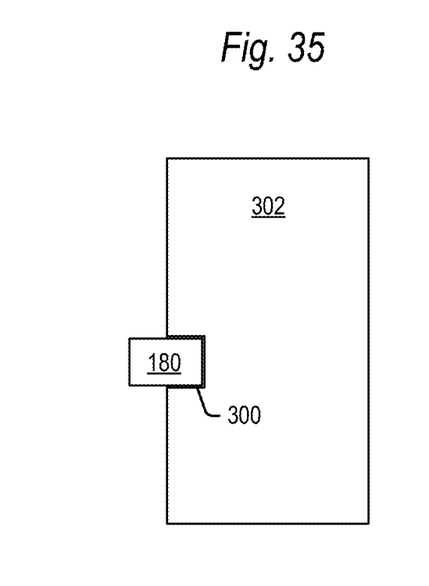
FIG. 35 is a schematic representation of a USB semiconductor device connected to the slot of a host device.
Figure 36:
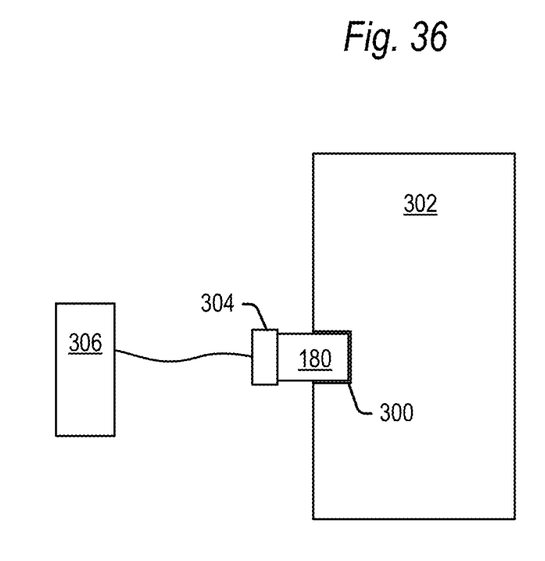
FIG. 36 is an alternative embodiment showing a second USB device connected to a host device through the USB semiconductor device of the present technology.

In embodiments where the finger grip and are omitted, the first end 142*a* of the electrical contacts 142 (FIGS. 11, 12 and 29) may be used to electrically connect another USB compatible device with a host device through the USB device 180. In particular, in embodiments, the distal end of the shell 182 is open and the end 142*a* of electrical contacts are exposed. FIG. 35 is a schematic image of the USB device 180 inserted into a slot 300 of a host device 302. FIG. 36 is a schematic image of the USB device 180 connected to the host device 302 as in FIG. 35, but further including a type-C USB connector 304 affixed to the electrical contacts 142 at the distal end of USB device 180. A second USB device 306 may be affixed to the USB connector 304 so as to communicate with the host device 302 through the USB device 180 of the present technology.

In particular, the second USB device 306 may use the electrical contacts 142 of the bottom side contacts assembly 140 to carry audio, video, other data, instructions and power to/from the host device 302. The controller die 102*a* and/or controllers within the host device 302 or second USB device 306 may coordinate the transmission of data and other signals from both the USB device 180 and second USB device 306 to/from the host device 302. Alternatively, the USB device 180 may remain dormant as data and other signals are passed between the second USB device 306 and the host device 302.

In further embodiments, the USB device 180 of the present technology may be used only with the second USB device 306 (i.e., without the host device 302) to transfer data and power between the USB device 180 and the second USB device 306 using the USB connector 304.

As noted in the Background section, conventional USB devices included a flash memory connected to a separate USB connector. Integrating the SIP module 100 together with the USB connector in accordance with the present technology reduces the length of the USB device 180 and compared to conventional designs. In embodiments, the USB device 180 may have an overall length of 20 mm to 25 mm. Additionally, without the finger grip 192, the USB device 180 has a constant cross section from the proximal end to the distal end. That is, the width and height of the USB device 180 are constant across the length of the device 180, from the proximal end to the distal end, which is no wider than a USB slot within which the proximal end is received.

Additionally, by integrating the SIP module 100 with the connector, the present technology provides improved thermal conduction away from the SIP module 100 to the host device. For example, the SIP module 100, and in particular controller die 102*a*, is closer to the host device within the USB device 180 than in conventional designs. Thus, there is a shorter distance for the heat to travel from the controller die 102*a* to the host device.

Figure 6:
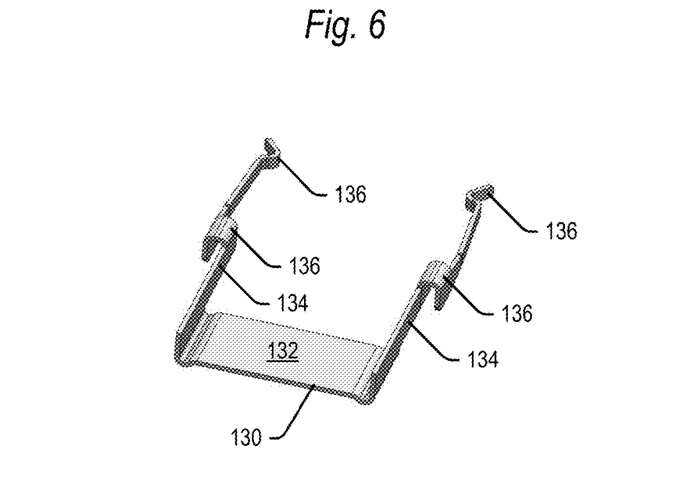
FIG. 6 is a perspective view of a latch assembly according to an embodiment of the present technology.
Figure 7:
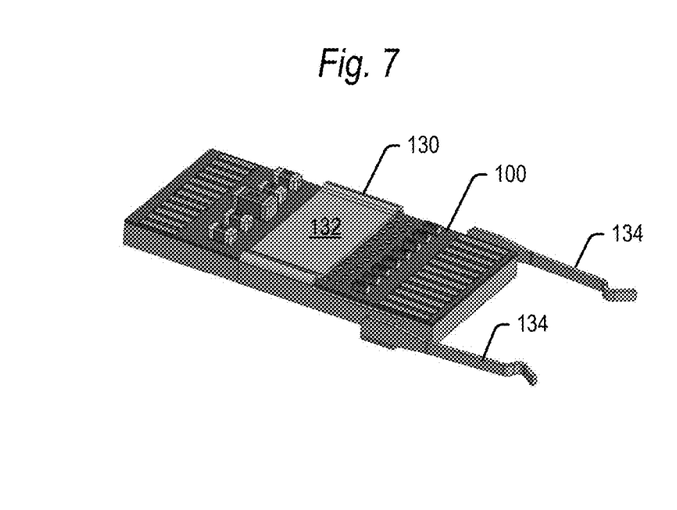
FIGS. 7-9 are perspective, top and edge views, respectively, of a latch assembly mounted to the USB semiconductor device according to an embodiment of the present technology.
Figure 8:
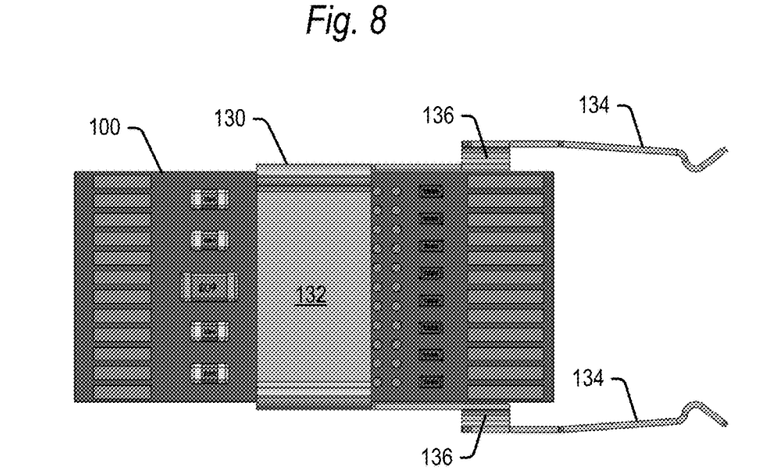
Figure 9:
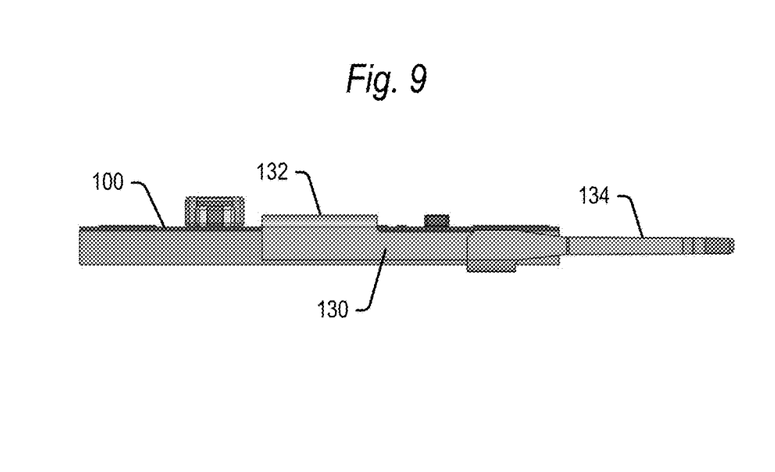

Additionally, the present technology provides several metal contacts and heat conduction paths adjacent to the controller die 102*a* for carrying heat away from the controller die 102*a*. As noted above with respect to FIGS. 3-5, thermal vias 108*a* carry heat from the controller die 102*a* to the thermal pad 128. As seen in FIGS. 6-8, the latch assembly 130 includes a base 132 and arms 134 which are effective at carrying heat away from the thermal pad 128 to the host device. Further still, the electrical contacts 142 of the bottom side contacts assembly 140 and electrical contacts 152 of the top side contacts assembly 150 surround the SIP module 100 with metal which also facilitate drawing of heat away from the SIP module 100 and into the host device via the contacts 142, 152.

Each of the latching assembly 130, bottom side contacts assembly 140, top side contacts assembly 150 and the tip assembly 160 are modular assemblies including alignment features that allow for easy, and possibly automated, fabrication of the USB device 180 around the SIP module 100. For example, the bottom side contacts assembly 140 includes sides of the plastic base 144 and the space 146 defined by the bent electrical contacts 142a (FIGS. 10-12), which both enable quick, easy and accurate mounting of the bottom side contacts assembly 140 around the SIP module 100. The top side contacts assembly 150 may include alignment features 156 which mate within the channels 136 of the latch assembly 130 (FIGS. 15 and 16) to allow for quick, easy and accurate mounting of the top side contacts assembly 150 relative to the latch assembly 130 and SIP module 100. The tip assembly 160 includes several features such as elongate openings 165 and tongue 166 which allow for quick, easy and accurate mounting of the tip assembly over the SIP module 100 and against the bottom and top contacts assemblies 140, 150. Lastly, the outer shell 182 may be quickly and easily affixed over the SIP module 100, bottom and top contacts assemblies 140, 150, tip assembly 160 and grounding clip assemblies 170, and fixed in position as described above.

In embodiments described above, the bottom and top side contacts assemblies 140, 150 include electrical contacts configured to operate according to the type-C USB standard. However, in further embodiments, it is understood that the bottom and/or top side contacts assemblies 140, 150 may be configured to operate according to other USB standards, including for example types A, B, mini-A, mini-B, micro-A and micro-B.

In embodiments described above, the contact fingers 120 are both positioned on a surface 116 at opposed edges of the SIP device 100. In further embodiments, the contact fingers 120 may be positioned on the same surface 116, but they need not the directly adjacent the edges of the SIP device 100. In further embodiments, a first set of the contact fingers 120 (for example at the proximate edge of the SIP device 100) may be on the surface 116, but the second set of contact fingers 120 (for example at the distal edge of the SIP device 100) may be on the bottom surface opposite surface 116. In such an embodiment, instead of the electrical contacts 142 extending up and around the distal edge of the SIP device 100, the electrical contacts 142 may terminate at the contact fingers 120 on the bottom surface of the SIP device 100.

In summary, in one example, the present technology relates to a universal serial bus (USB) device, comprising: a semiconductor device, comprising: first and second opposed surfaces extending between first and second edges; one or more semiconductor die affixed to one of the first and second opposed surfaces, and first and second sets of contact fingers; and a USB connector for connection within a USB slot, the USB connector comprising: a first set of electrical contacts having first ends electrically coupled to the first set of contact fingers, and the first set of electrical contacts having second ends, opposite the first ends, terminating at a proximal end of the USB device, and a second set of electrical contacts having first ends electrically coupled to the second set of contact fingers, and the second set of electrical contacts having second ends, opposite the first ends, terminating at the proximal end of the USB device.

In another example, the present technology relates to a universal serial bus (USB) device, comprising: a semiconductor device, comprising: first and second opposed surfaces extending between first and second edges; one or more semiconductor die affixed to one of the first and second opposed surfaces, a first set of contact fingers on the first surface adjacent the first edge, and a second set of contact fingers on the first surface adjacent the second edge; and a USB connector for connection within a USB slot, the USB connector comprising: a first set of electrical contacts having first ends in contact with the first set of contact fingers, and the first set of electrical contacts having second ends, opposite the first ends, terminating at a proximal end of the USB device, and a second set of electrical contacts having first ends in contact with the second set of contact fingers, and the second set of electrical contacts having second ends, opposite the first ends, terminating at the proximal end of the USB device.

In a further example, the present technology relates to a universal serial bus (USB) device, comprising: a semiconductor device comprising one or more semiconductor die, the semiconductor device including first and second opposed surfaces, and first and second sets of contact fingers; a bottom side contacts assembly affixed to the first surface of the semiconductor device, the bottom side contacts assembly comprising a first set of electrical contacts having first ends electrically coupled to the first set of contact fingers and second ends terminating at a proximal end of the USB device; a top side contacts assembly affixed to the second surface of the semiconductor device, the top side contacts assembly comprising a first set of electrical contacts having first ends electrically coupled to the second set of contact fingers and second ends terminating at the proximal end of the USB device; and a tip assembly fitting over the proximal end of the USB device and positioned adjacent the bottom and top side contacts assembly.

In another example, the present technology relates to a universal serial bus (USB) device having a proximal end configured to be received within a slot of a host device, comprising: a semiconductor device comprising one or more semiconductor die, the semiconductor device including first and second opposed surfaces, and first and second sets of contact fingers on the first surface; first electrical communication means for electrically coupling the first set of contact fingers with the proximal end of the USB device; and second electrical communication means for electrically coupling the second set of contact fingers with the proximal end of the USB device.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A universal serial bus (USB) device, comprising:
   a semiconductor device, comprising:
      first and second opposed surfaces extending between first and second edges;
      one or more semiconductor die affixed to one of the first and second opposed surfaces, and
      a first set of contact fingers mounted at a first position on one of the first and second opposed surfaces, and
      a second set of contact fingers mounted at a second position on one of the first and second opposed surfaces different than the first position, the first and second sets of contact fingers electrically connected to the one or more semiconductor die; and a USB connector configured to connect with a host device within a USB slot, the USB connector comprising:

a first set of electrical contacts mounted within a first contacts assembly affixed on the first surface of the semiconductor device, the first set of electrical contacts having first ends physically coupled to the first set of contact fingers, and the first set of electrical contacts having second ends, opposite the first ends, terminating at a proximal end of the USB device, and a second set of electrical contacts mounted within a second contacts assembly affixed on the second surface of the semiconductor device, the second set of electrical contacts having first ends physically coupled to the second set of contact fingers, and the second set of electrical contacts having second ends, opposite the first ends, terminating at the proximal end of the USB device.

2. The USB device of claim 1, wherein at least one of the first and second sets of electrical contacts are configured to carry heat away from the one or more semiconductor die.

3. The USB device of claim 1, further comprising a third assembly fitting over the proximal end of the USB device, adjacent the first contacts assembly on the first surface and adjacent the second contacts assembly on the second surface, the third assembly comprising an end covering the second ends of the first and second sets of electrical contacts.

4. The USB device of claim 3, further comprising a shell encasing the semiconductor device, the first and second contacts assemblies and the third assembly.

5. The USB device of claim 1, further comprising a latching assembly, the latching assembly comprising:

a base positioned adjacent the one or more semiconductor die; and a pair of arms extending from the base to the proximal end of the USB device.

6. The USB device of claim 5, wherein the base is configured to draw heat away from the one or more semiconductor die, and the pair of arms are configured to draw heat away from the base to the proximal end of the USB device.

7. A universal serial bus (USB) device having a proximal end configured to fit within a host device, comprising:

a semiconductor device, comprising:

first and second opposed surfaces extending between first and second edges, the first edge nearest the proximal end of the USB device and the second edge farthest from the proximal end of the USB device;

one or more semiconductor die affixed to one of the first and second opposed surfaces, a first set of contact fingers on the first surface adjacent the first edge, and a second set of contact fingers on the first surface adjacent the second edge; and a USB connector for connection within a USB slot, the USB connector comprising:

a first set of electrical contacts having first ends in physical contact with the first set of contact fingers, and the first set of electrical contacts having second ends, opposite the first ends, terminating at a proximal end of the USB device, and a second set of electrical contacts having first ends in physical contact with the second set of contact fingers, and the second set of electrical contacts having second ends, opposite the first ends, terminating at the proximal end of the USB device.

8. The USB device of claim 7, wherein the second set of electrical contacts extend from the proximal end of the USB device, along the second surface and into contact with the second set of contact fingers on the first surface of the semiconductor device.

9. The USB device of claim 8, wherein the second set of electrical contacts bend around the first edge of the semiconductor device and into contact with the second set of contact fingers on the first surface of the semiconductor device.

10. The USB device of claim 8, wherein the first set of electrical contacts extend from the proximal end of the USB device, along the first surface and into contact with the first set of contact fingers on the first surface of the semiconductor device.

11. The USB device of claim 8, wherein the first set of electrical contacts are contained within a first modular assembly, and the second set of electrical contacts are contained within a second modular assembly, the first and second modular assemblies affixing to the first and second surfaces of the semiconductor device.

12. The USB device of claim 11, further containing a third modular assembly comprising:

a base positioned adjacent the one or more semiconductor die; and a pair of arms extending from the base to the proximal end of the USB device.

13. The USB device of claim 12, wherein the base is configured to draw heat away from the one or more semiconductor die, and the pair of arms are configured to draw heat away from the base to the proximal end of the USB device.

14. The USB device of claim 7, wherein the first and second sets of electrical contacts at the proximal end are physically configured according to the type-C USB standard.

15. A universal serial bus (USB) device, comprising:

a semiconductor device comprising one or more semiconductor die, the semiconductor device including first and second opposed surfaces, and first and second sets of contact fingers connected to the one or more semiconductor die;

a bottom side contacts assembly affixed to the first surface of the semiconductor device, the bottom side contacts assembly comprising a first set of electrical contacts having first ends electrically coupled to the first set of contact fingers and second ends terminating at a proximal end of the USB device;

a top side contacts assembly affixed to the second surface of the semiconductor device, the top side contacts assembly comprising a first set of electrical contacts having first ends electrically coupled to the second set of contact fingers and second ends terminating at the proximal end of the USB device; and a tip assembly fitting over the proximal end of the USB device and positioned adjacent the bottom and top side contacts assembly.

16. The USB device of claim 15, wherein the first set of contact fingers are positioned on the first surface of the semiconductor device, and the first set of electrical contacts in the bottom side contacts assembly extend from the proximal end of the USB device, along the second surface and into contact with the first set of contact fingers on the first surface of the semiconductor device.

17. The USB device of claim 16, wherein the first set of electrical contacts bend around the first edge of the semiconductor device and into contact with the first set of contact fingers on the first surface of the semiconductor device.

18. The USB device of claim 16, wherein the second set of contact fingers are positioned on the first surface of the semiconductor device, and the second set of electrical contacts in the top side contacts assembly extend from the proximal end of the USB device, along the first surface and into contact with the second set of contact fingers on the first surface of the semiconductor device.

19. The USB device of claim 15, further comprising a latching assembly affixed to the semiconductor device, the latching assembly comprising:
  a base positioned adjacent the one or more semiconductor die; and
  a pair of arms extending from the base to the proximal end of the USB device.

20. The USB device of claim 19, wherein the base is configured to draw heat away from the one or more semiconductor die, and the pair of arms are configured to draw heat away from the base to the proximal end of the USB device.

21. The USB device of claim 19, wherein the bottom side contacts assembly engages the first and second surfaces of the semiconductor device to affix the bottom side contacts assembly to the semiconductor device.

22. The USB device of claim 21, wherein the top side contacts assembly engages the first surface of the semiconductor device and the latching assembly to affix the top side contacts assembly to the semiconductor device.

23. The USB device of claim 22, wherein the tip assembly engages the bottom side contacts assembly and the top side contacts assembly to affix the tip assembly to the semiconductor device.

24. The USB device of claim 23, further comprising a shell encasing the semiconductor device, the latching assembly, the bottom side contacts assembly, the top sides contact assembly and the tip assembly.

25. A universal serial bus (USB) device having a proximal end configured to be received within a slot of a host device, comprising:
  a semiconductor device comprising one or more semiconductor die, the semiconductor device including first and second opposed surfaces, and a first set of contact fingers mounted at a first position on the first surface nearest to the proximal end, and a second set of contact fingers mounted at a second position on the first surface farthest from the proximal end;
  first electrical communication means for physically coupling the first set of contact fingers with the proximal end of the USB device; and
  second electrical communication means for physically coupling the second set of contact fingers with the proximal end of the USB device.

26. A universal serial bus (USB) device comprising a proximal end configured to fit within a host device, the USB device comprising:
  a semiconductor device comprising:
    first and second surfaces extending between first and second edges of the semiconductor device, the first edge nearest the proximal end of the USB device, the second edge nearest a distal end of the USB device opposite the proximal end of the USB device,
    one or more semiconductor die, and
    first and second sets of contact fingers electrically coupled to the one or more semiconductor die, the first set of contact fingers positioned on the first surface nearest the proximal edge, and the second set of contact fingers positioned on the first surface nearest the distal edge;
  a first set of electrical contacts having first ends electrically coupled to the first set of contact fingers and second ends terminating at the proximal end of the USB device; and
  a second set of electrical contacts having first ends electrically coupled to the second set of contact fingers, extending around the second edge of the semiconductor device, along the second surface of the semiconductor device and having second ends terminating at the proximal end of the USB device.

27. The USB device of claim 26, wherein the first set of electrical contacts extend from the proximal end of the USB device, along the first surface and into contact with the first set of contact fingers on the first surface of the semiconductor device.

28. The USB device of claim 26, wherein the first set of electrical contacts are contained within a first modular assembly, and the second set of electrical contacts are contained within a second modular assembly, the first and second modular assemblies affixing to the first and second surfaces of the semiconductor device.

29. The USB device of claim 28, further containing a third modular assembly comprising:
  a base positioned adjacent the one or more semiconductor die; and
  a pair of arms extending from the base to the proximal end of the USB device.

* * * * *